United States Patent [19]
Geshner et al.

[11] 4,105,468
[45] Aug. 8, 1978

[54] METHOD FOR REMOVING DEFECTS FROM CHROMIUM AND CHROMIUM OXIDE PHOTOMASKS

[75] Inventors: Robert Andrew Geshner, Warren; Joseph Mitchell, Jr., Kinnelon, both of N.J.

[73] Assignee: RCA Corp., New York, N.Y.

[21] Appl. No.: 805,153

[22] Filed: Jun. 9, 1977

Related U.S. Application Data

[63] Continuation of Ser. No. 684,965, May 10, 1976, abandoned.

[51] Int. Cl.² .................................................. C23G 1/02
[52] U.S. Cl. ............................................. 134/3; 134/28; 156/635; 156/656; 219/121 LM
[58] Field of Search ............... 156/628, 635, 654, 656, 156/664; 148/187; 219/121 LM; 134/2, 3, 28

[56] References Cited

U.S. PATENT DOCUMENTS

| | | | |
|---|---|---|---|
| 3,539,408 | 11/1970 | Cashau et al. | 156/635 |
| 3,673,018 | 10/1972 | Dingwall | 156/650 |
| 3,947,801 | 3/1976 | Bube | 219/121 LM |

*Primary Examiner*—Jerome W. Massie
*Attorney, Agent, or Firm*—H. Christoffersen; R. P. Williams; Sanford J. Asman

[57] ABSTRACT

Removal of selected, isolated defects comprised of excess chromium (Cr) or chromium oxide ($Cr_2O_3$) from photomasks comprises contacting at least the defect area by a suitable acid and initiating the etch of the defect area by contacting the defect area with a metal probe made from a suitable material. Excess chromium or chromium oxide areas may be isolated by using a laser to separate the areas from areas which are to remain.

12 Claims, 8 Drawing Figures

METHOD FOR REMOVING DEFECTS FROM CHROMIUM AND CHROMIUM OXIDE PHOTOMASKS

This is a continuation division of application Ser. No. 684,965, filed May 10, 1976, now abandoned.

The present invention relates to photomasks of the type used in the manufacture of semiconductor devices. In particular, the invention relates to a process for repairing defective photomasks and reticle patterns by removing excess chromium or chromium oxide. In addition the present invention may be used to manufacture photomasks from chromium or chromium oxide coated substrates.

In the manufacture of a semiconductor device photomasks are used to define areas of photosensitive material, called photoresist, which are then developed to expose underlying areas of the semiconductor material for the purpose of etching or diffusion or ion implantation or the like. Photomasks which are actually employed in the manufacture of semiconductor material are manufactured photographically by using a master called a reticle which is used to expose the actual photomasks used in the manufacture of the semiconductor devices. The image on the reticle is generally substantially larger than the image which is present on the photomasks. A photomask generally includes hundreds of images which are duplicated from the reticle by a step and repeat camera. It is very important that reticles be photographically accurate and that they be kept clean, so that photomasks made from them will not include errors introduced by the reticle. Reticles are generally made of a hard material such as chromium (Cr) having a thickness of about 800Å on a transparent glass substrate. The chromium layer may be covered by a layer of chromium oxide ($Cr_2O_3$) having a thickness of about 200Å. Reticles or photomasks which are comprised only of chromium on a substrate will be referred to herein as chromium masks while reticles or photomasks which comprise a layer of chromium oxide over the chromium layer will be referred to herein as chromium oxide masks. Any reference herein to chromium oxide is meant to include also a layer of chromium oxide over a layer of chromium.

It is desirable to remove as many defects as possible from reticles in order that such defects are not reproduced on the photomasks which are produced from the reticles. One type of reproducible defect which should be removed involves an excess amount of chromium or chromium oxide on the reticle. Such a defect creates an opaque area in the reticle where a transparent area is desired.

Heretofore, lasers have been employed to remove excess areas of chromium or chromium oxide from reticles. The removal of such excess material from reticles by means of a laser is accomplished by aiming the laser at an area to be removed and then turning on the laser to remove the material, which is melted by the laser and pulled back by the surface tension of adjacent material. Unfortunately, the underlying substrate can be melted and damaged somewhat in the process, and such damage to the substrate may be photolithographically reproduced.

Another problem with removal of excess material by laser involves the substantial time which is required to move the laser beam over areas to be removed.

Figure 1:
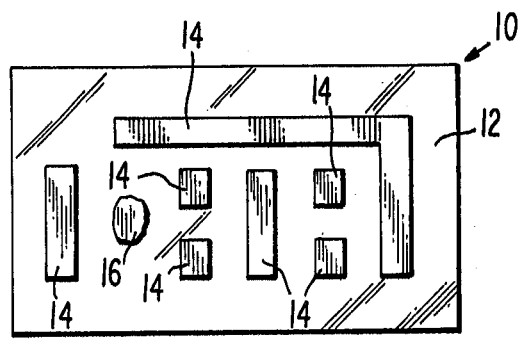
FIG. 1 is a top view of a photomask containing an isolated defect.

Referring generally to FIG. 1, a top view of a portion of a photomask 10 is shown. The photomask 10 comprises a substrate 12 of a transparent material such as glass having deposited thereon various desired areas 14 as well as a defect area 16. The desired and defect areas 14, 16 are comprised of materials which are opaque to the light which will be used to expose photoresist materials through the photomask 10. While various materials can be used for forming opaque areas on the photomask 10, the method of the present invention relates to correction of defects on photomasks which use either chromium or chromium oxide opaque portions.

The term "defects" as used herein means an excess amount of opaque material on a photomask, and the term will be used whether the excess amount is due to an error in the original design, inadequate removal of material, or material which is to be removed in the process of manufacturing a photomask.

With reference to FIG. 1, the defect area 16 which is isolated from the desired areas of the pattern, is to be removed from the photomask 10. It has been found that if the defect area is made of chromium or chromium oxide, it is possible to remove such isolated defects without affecting adjoining desired areas 14 by employing the method of the present invention.

In accordance with the present invention an acid selected from Table I is placed on the surface of the photomask 10 so that it covers at least the defect area 16. The acid may, in addition, cover desired areas 14. No immediate reaction will occur when the acid contacts either of the regions 14, 16. Next, a metal probe is brought into contact with the defect areas 16. Care must be employed to prevent the metal probe from contacting any of the adjacent desired areas 14 which are covered by acid and which are not to be removed. The metal probe should be made of a metal chosen from Table I depending upon the particular material to be removed and the acid which is being used. Immediately after the probe is brought into contact with the undesired areas 16, it has been found that a reaction will be initiated which will cause only the undesired areas 16 to be completely etched away. The etching of each undesired area 16 will be initiated and, surprisingly, the etching will continue even if the metal probe is withdrawn from contact immediately after the undesired area 16 has been contacted. The desired areas 14 will be unaffected by the acid covering them as long as they are not contacted by the metal probe.

TABLE I

| LAYER TO BE REMOVED | ACID | PROBE MATERIAL WHICH WILL INITIATE ETCH |
| --- | --- | --- |
| Cr | HCl | Zn, Fe, Al, Cu |
| Cr | $H_2SO_4$ | Zn, Fe, Al |
| Cr | $H_3PO_4$ | Zn |
| Cr + $Cr_2O_3$ | HCl | Zn, Fe, Al |
| Cr + $Cr_2O_3$ | $H_2SO_4$ | Zn |

Figure 2:
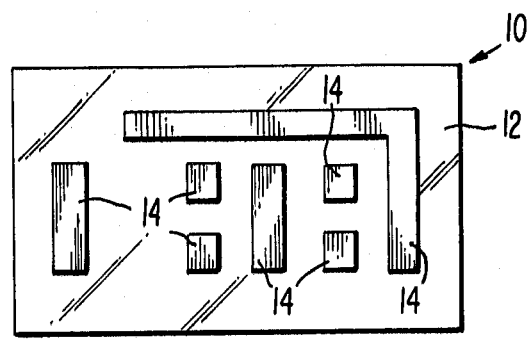
FIG. 2 is a top view of the photomask of FIG. 1 with the defect removed.

It has been found to be particularly difficult to lower a metal probe onto a very small undesired area 16 when such area 16 is covered by acid, because the surface tension of the acid will sometimes deflect the metal probe causing it to contact an adjacent desired area 14 with the resulting removal of the desired area 14. In order to avoid that problem, the method is altered somewhat in that the metal probe is lowered onto a small undesired area 16 without first covering the area 16 with acid. Thereafter, a drop of acid can be placed in close proximity to the metal probe but without touching either the undesired area 16 or the metal probe. The presence of the metal probe serves as a medium upon which the acid will condense, and such condensed acid flows down the probe onto the small undesired area 16 resulting in the etch of only the undesired area 16. Following the removal of the undesired area 16, the photomask 10 should be rinsed to remove any of the remaining acid. Referring to FIG. 2, the photomask 10 is shown with the undesired area 16 removed.

Figure 3:
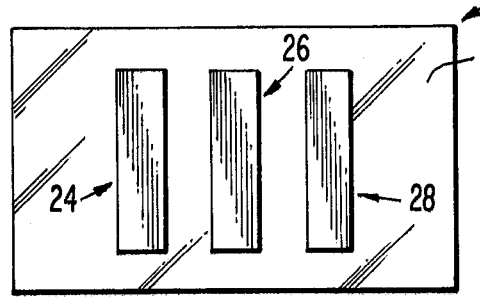
FIG. 3 is a top view of a photomask containing non-isolated defects.

In the event that a defect in the photomask is not isolated from any of the desired areas, it is necessary to isolate the defect before it can be removed from the photomask. Referring now to FIG. 3, a photomask 20 comprising a substrate 22 covered in part by chromium or chromium oxide opaque areas 24, 26, 28 is shown. Each of the opaque areas 24, 26, 28 is comprised of both a desired area and a defect. The defects in each of the areas 24, 26, 28 are not isolated from the desired areas. Accordingly, it is necessary to isolate each defect area prior to removal of the defect areas.

Isolation of the defect areas can be accomplished by using a laser having a fine diameter beam. An example of such a laser is one made by the Florod Corporation as their Model MT which has a beam having a diameter of approximately 2 micrometers. The laser is used to melt the excess chromium or chromium oxide between the desired areas and the defects. The melted material is drawn away from the spot at which the laser beam is aimed by the surface tension of adjacent material.

Figure 4:
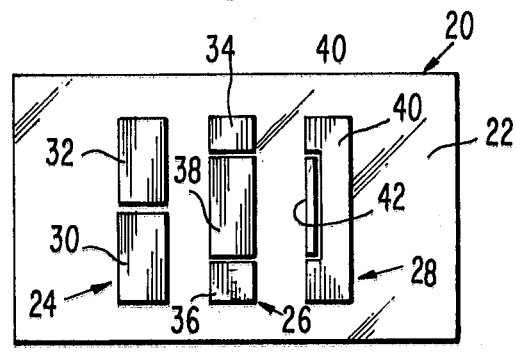
FIG. 4 is a top view of the photomask of FIG. 3 following isolation of the defects.

Referring now to FIG. 4, the area 24 is shown to be comprised of a desired area 30 and a defect area 32. The opaque area 26 is comprised of two desired areas 34, 36 and a defect 38. The area 28 is comprised of a desired area 40 and a defect area 42. The spaces between the desired areas and defects represent the areas of material removed by the laser.

Figure 5:
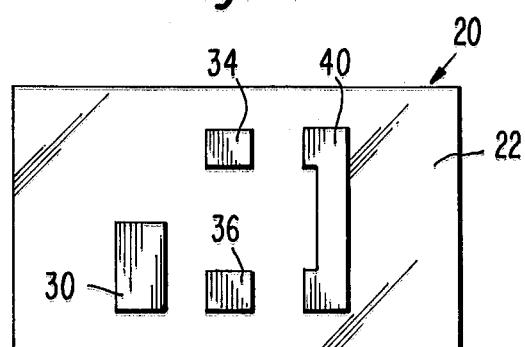
FIG. 5 is a top view of the photomask of FIGS. 3 and 4 following removal of the defects.

Following the physical and electrical isolation of the defects 32, 38, 42 the surface of the photomask 20 is covered with a suitable acid, chosen from Table I, which covers at least the defect areas 32, 38, 42. Then, a probe made of a metal chosen from Table I to correspond with the material being removed and the acid chosen and having a diameter small enough to insure that it does not contact any of the desired areas 30, 34, 36, 40, is used to contact the defects 32, 38, 42 while they are covered by the acid. After each defect is contacted by the probe, the defect so contacted will begin to etch and the etch will continue until the defect is removed resulting in the photomask having the desired pattern as shown in FIG. 5.

Figure 6:
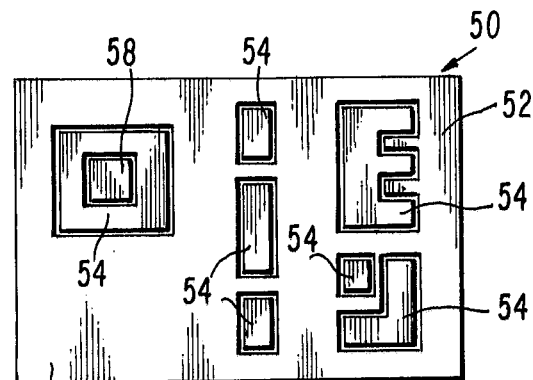
FIG. 6 is a top view of a substrate with a pattern defined by use of a laser.

The method of the present invention may be employed to remove defects which are substantially larger than the desired areas. Desired areas may even be surrounded by the defects. In fact, the method of the present invention may be employed in manufacturing photomasks. Referring now to FIG. 6, a photomask 50 is shown in the process of being manufactured by the present invention. The photomask 50 comprises a substrate 52 of a transparent material such as glass which is covered on one side by either chromium or chromium oxide.

A pattern of desired areas 54 is formed on the surface of the substrate by using a laser to remove the opaque material surrounding each desired area 54, thereby to separate each desired area 54 from the surrounding portions 56 of the opaque material. In addition, any enclosed undesired portions, such as the area 58, are also separated from the desired portion 54 which surrounds it by use of a laser.

Following the electrical isolation of all desired areas 54 from all undesired areas 56, 58, the photomask 50 is placed in a solution of acid, chosen from Table I, and the undesired portions 56, 58 are contacted by a probe, made of a metal chosen from Table I. Contact of the probe to any portion of the opaque region 56 which is covered by the acid will cause all portions of the region 56 which are covered by the acid to be etched away. The regions 54 and 58 will be unaffected by the removal of the region 56 despite the fact that the regions 54 and 58 are also immersed in the acid.

Figure 7:
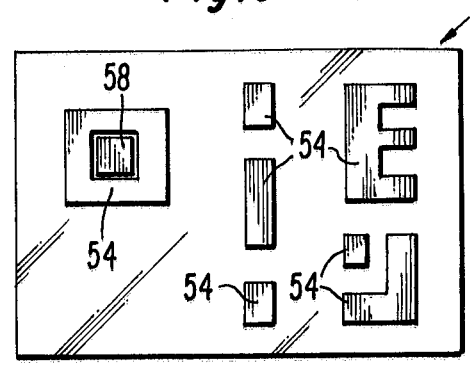
FIG. 7 is a top view of the substrate of FIG. 6 after removing opaque areas surrounding desired areas.

Following the removal of the region 56, only opaque regions 54 and 58 will remain on the substrate 52 as shown in FIG. 7. The metallic probe may then be applied to the region 58.

Figure 8:
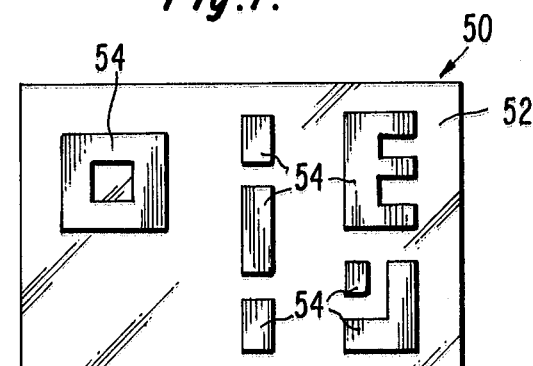
FIG. 8 is a top view of the substrate of FIGS. 6 and 7 after removing opaque areas surrounded by desired areas.

Following contact of the probe to the region 58, the region 58 will be etched completely away leaving the desired photomask pattern shown in FIG. 8.

Presently, photomasks are generally manufactured by using a programmed digital computer to operate a so-called plotter in order to obtain a very large version of the pattern to be employed on the photomask. The large pattern thus produced is photographically reduced to a size which is necessary for the manufacturing of the photomasks. By using the present invention, however, it is contemplated that a programmed digital computer of the type used to operate a plotter can instead be used to move a laser across a chromium or chromium oxide covered substrate. Then, through the use of the present invention, as described with reference to Table I and FIGS. 6–8, it is possible to produce a desired photomask in a single step, thereby avoiding the photographic reproduction steps.

We claim:

1. A method for removing isolated portions of material from a substrate containing both material to be removed and material not to be removed where both materials are the same, and the isolated portions of the material which are to be removed are electrically separated from the material which is not to be removed, comprising the steps of:

(a) selecting a substrate having applied thereon an exposed opaque material selected from the group consisting of chromium and chromium oxide;

(b) applying an acid which is an etchant for said opaque material when contacted with a metal which initiates the etching reaction at least adjacent the portions of the material which are to be removed which acid contacts said exposed material which is not to be removed before any etch is initiated; and (c) contacting only those portions which are to be removed by a metallic probe whereby contact between said probe and said portions will initiate an etch of said portions by said acid which etch removes said portions from said substrate, but which acid does not affect said exposed material which said acid also contacts but which have not been contacted by said metallic probe.

2. The method of claim 1 wherein said acid is selected from the group consisting of hydrochloric acid, sulphuric acid, and phosphoric acid.

3. The method of claim 2 wherein said metallic probe is comprised of a material selected from the group consisting of zinc, iron, aluminum, and copper.

4. The method of claim 1 further comprising the step of rinsing off said acid following the removal of said opaque areas.

5. The method of claim 1 wherein said acid is applied directly to the portions of the materials which are to be removed.

6. A method for removing portions of material from a substrate comprising the steps of:

(a) selecting a substrate having applied thereon an opaque material selected from the group consisting of chromium and chromium oxide;

(b) electrically isolating areas which are to be removed from other areas of said opaque material which are to remain;

(c) applying acid at least adjacent the portions of the materials which are to be removed; and (d) contacting only those portions which are to be removed by a metallic probe.

7. The method of claim 6 wherein said acid is selected from the group consisting of hydrofluoric acid, sulfuric acid, and phosphoric acid.

8. The method of claim 6 wherein said metallic probe is comprised of a material selected from the group consisting of zinc, iron, aluminum, and copper.

9. The method of claim 6 further comprising the step of rinsing off said acid following the removal of said opaque areas.

10. The method of claim 6 wherein said acid is applied directly to the portions of the materials which are to be removed.

11. The method of claim 6 wherein electrically isolating the material to be removed is carried out by a laser and material removed by said laser has a width not greater than the beam width of the laser.

12. The method of claim 11 wherein said beam has a diameter of approximately 2 micrometers.

* * * * *

UNITED STATES PATENT AND TRADEMARK OFFICE
CERTIFICATE OF CORRECTION

PATENT NO. : 4,105,468

DATED : August 8, 1978

INVENTOR(S) : Robert Andrew Geshner, Joseph Mitchell Jr.

It is certified that error appears in the above-identified patent and that said Letters Patent is hereby corrected as shown below:

Column 1, line 6, delete "division".

Signed and Sealed this

Twentieth Day of March 1979

[SEAL]

Attest:

RUTH C. MASON
*Attesting Officer*

DONALD W. BANNER
*Commissioner of Patents and Trademarks*